United States Patent
Banerjee et al.

(10) Patent No.: US 8,629,427 B2
(45) Date of Patent: Jan. 14, 2014

(54) TOPOLOGICAL INSULATOR-BASED FIELD-EFFECT TRANSISTOR

(75) Inventors: Sanjay K. Banerjee, Austin, TX (US); Leonard Franklin Register, II, Round Rock, TX (US); Allan MacDonald, Austin, TX (US); Bhagawan R. Sahu, Austin, TX (US); Priyamvada Jadaun, Austin, TX (US); Jiwon Chang, Austin, TX (US)

(73) Assignee: Texas A&M University, College Station, TX (US)

( * ) Notice: Subject to any disclaimer, the term of this patent is extended or adjusted under 35 U.S.C. 154(b) by 295 days.

(21) Appl. No.: 13/097,405

(22) Filed: Apr. 29, 2011

(65) Prior Publication Data

US 2012/0273763 A1    Nov. 1, 2012

(51) Int. Cl.
*H01L 29/06* (2006.01)

(52) U.S. Cl.
USPC ........ 257/20; 257/39; 257/414; 257/E29.168; 438/201; 438/211; 438/257; 438/591

(58) Field of Classification Search
USPC ............... 257/30, 39, 79, 414, 429, E29.168; 438/201, 211, 257, 591, 593
See application file for complete search history.

(56) References Cited

U.S. PATENT DOCUMENTS

| | | | |
|---|---|---|---|
| 5,291,274 A * | 3/1994 | Tamura | 257/30 |
| 2003/0113450 A1 * | 6/2003 | Park et al. | 427/255.28 |
| 2006/0054982 A1 * | 3/2006 | Yang et al. | 257/414 |

* cited by examiner

*Primary Examiner* — Mark A Laurenzi
(74) *Attorney, Agent, or Firm* — Antony P. Ng; Yudell Isidore Ng Russell PLLC

(57) ABSTRACT

A Topological INsulator-based field-effect transistor (TIN-FET) is disclosed. The TINFET includes a first and second gate dielectric layers separated by a topological insulator (TI) layer. A first gate contact is connected to the first gate dielectric layer on the surface that is opposite the TI layer. A second gate contact may be connected to the second gate dielectric layer on the surface that is opposite the TI layer. A first TI surface contact is connected to one surface of the TI layer, and a second TI surface contact is connected to the second surface of the TI layer.

11 Claims, 3 Drawing Sheets

TOPOLOGICAL INSULATOR-BASED FIELD-EFFECT TRANSISTOR

STATEMENT OF GOVERNMENT INTEREST

The present invention was made with United States Government support under NIST Award number 70NANB7H6168, awarded by the NIST. The United States Government has certain rights in the present invention.

BACKGROUND OF THE INVENTION

1. Technical Field

The present invention relates to field-effect transistors in general, and in particular to topological insulator-based field-effect transistors.

2. Description of Related Art

For a metal-oxide-semiconductor field-effect transistor (MOSFET), the gate controls an electrical current flow between the source and drain by controlling the height of the conduction channel in energy below a threshold or through self-consistent electrostatics (i.e., the number of charge carriers within the channel above the threshold). Threshold is a point of switching between an ON state and an OFF state for a transistor. Above threshold in modem short channel devices (i.e., channel lengths of a few tens of nanometers), the injection efficiency of charge carriers into the channel is approaching the ideal of unity; only backscattering of some of the carriers to the source due to channel-to-gate-dielectric surface roughness, scattering from charged impurities or interaction with the vibrational modes of the semiconductor and/or dielectric within the channel reduces this injection efficiency by a factor of approximately two or less. Thus, ON-state currents can be quite large. However, the switching between the ON and OFF states is not entirely abrupt. At best, in a limit that can only be closely approached below threshold, the current can be reduced only by one factor of 10 (i.e., by one order of magnitude or, equivalently, by one decade) for every 2.3 $k_B T/q$ (i.e., natural log of 10 times Boltzmann's constant times temperature in degrees Kelvin, all divided by the magnitude of the charge of an electron), which is 60 mV at approximately room temperature (approximately 300 K). This limit is the result of "thermionic emission" of energetic charge carriers from the high energy tail of the carrier energy distribution in the source into the channel. The thermionically-emitted charge carriers represent a critical leakage path for MOSFETs in the OFF state within complementary metal-oxide semiconductor (CMOS) logic. Thermionic emission is a basic physical mechanism of transport in a MOSFET and cannot be eliminated by changing conduction channel materials or providing better gate control over the channel barrier height. Even if each MOSFET can be built atom-by-atom exactly as desired, the 2.3 $k_B T/q$ per decade change in current flow below threshold will still represent the best switching behavior possible for a MOSFET.

CMOS logic circuits are designed such that in any logic state under steady-state conditions, there is always at least one OFF-state transistor in series between the supply voltage and ground, so that only OFF-state leakage currents flow under steady-state conditions. Large currents flow only during switching transients, as required to quickly charge the gates of subsequent transistors and interconnects. However, in order to minimize power consumption in CMOS logic where transistors are only switching for a very small fraction of the time on average, transistor ON-OFF current ratios of multiple orders of magnitude (multiple factors of ten) still must be achieved to control the OFF-state power consumption. In order to achieve these ratios subject to the optimal 2.3 $k_B T/q$ per decade switching and to provide enough ON-state current for switching, an approximately half a volt change in the gate voltage between the ON and OFF states would be required under normal operating conditions—where the actual change possible in a CMOS circuit is defined by the power supply voltage—a lower limit that should be reached somewhere around the end of the next decade. However, the energy consumed during switching varies as the square of the supply voltage. Thus, historically, as device density increased in logic circuits, not only device dimensions have been reduced, but also supply voltages. Therefore, the inability to further scale supply voltages beyond this point represents a major roadblock to the continued improvement in the computational capabilities and energy efficiency of future logic circuits that employ MOSFETs. Consequently, it would be desirable to provide a new type of transistor capable of having substantially improved performance within this voltage limit, overcoming this voltage limit, or both.

SUMMARY OF THE INVENTION

In accordance with a preferred embodiment of the present invention, a Topological INsulator-based field-effect transistor (TINFET) includes a first and second gate dielectric layers separated by a topological insulator (TI) layer. A first gate contact is connected to the first gate dielectric layer on the surface that is opposite the TI layer. A second gate contact may be connected to the second gate dielectric layer on the surface that is opposite the TI layer. A first TI surface contact is connected to one surface of the TI layer, and a second TI surface contact is connected to the second surface of the TI layer.

In accordance with an alternative embodiment of the present invention, a TINFET includes a first and second TI layers separated by a dielectric layer. A first gate contact is connected to the first TI layer on the side that is opposite the dielectric layer. A second gate contact may be connected to the second TI layer on the side that is opposite the dielectric layer. A first TI surface contact is connected to the surface of the first TI layer that is adjacent to the dielectric layer. A second TI surface contact is connected to the surface of the second TI layer that is adjacent to the dielectric layer.

All features and advantages of the present invention will become apparent in the following detailed written description.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein.

DETAILED DESCRIPTION OF A PREFERRED EMBODIMENT

The present invention is related to a new type of transistor intended to allow improved performance at complementary metal-oxide semiconductor (CMOS) logic voltages and/or to allow lower voltage and power during operation than possible with CMOS logic. The new type of transistor, which can be called Topolgical INsulator-based FETs (TINFETs), is based on the concept of topological insulator (TI). TI is a new class of material that have a bulk insulating energy bandgap and robust, conducting quasi-two-dimensional surface states that lie within the energy range of the bulk energy bandgap. The conduction and valence bands of the TI surface state meet at a point in the Brillouin Zone commonly called the Dirac point.

In a perfect isolated TI layer, the Fermi level lies at the Dirac point such that these materials are semi-metallic. However, impurities, defects and surface contact effects with other materials may change the location of the Fermi level. These quantum Hall-like surface states are formed even in the absence of magnetic fields due to spin orbit coupling, and arise from topological properties of the band structures of these materials. These surface states are expected to be nearly immune to direct back-scattering from long-range interactions such as ionized impurity scattering or polar-optical photon scattering due to time reversal symmetry arguments, and therefore, are expected to be robustly conducting even when disordered.

Control of the surface state voltages and surface potentials on one or both faces of a topological insulator for MOSFET-like devices, or on opposite faces of a single topological insulator layer or on the inner faces of two adjacent topological insulator layers for single particle and many-particle tunneling-based devices, leads to multiple possible classes of TINFETs. Since these surfaces states are topologically robust and substantially immune to scattering, it will be possible to avoid the typical problems with surface states in conventional semiconductor devices such as MOSFETs.

Figure 1:
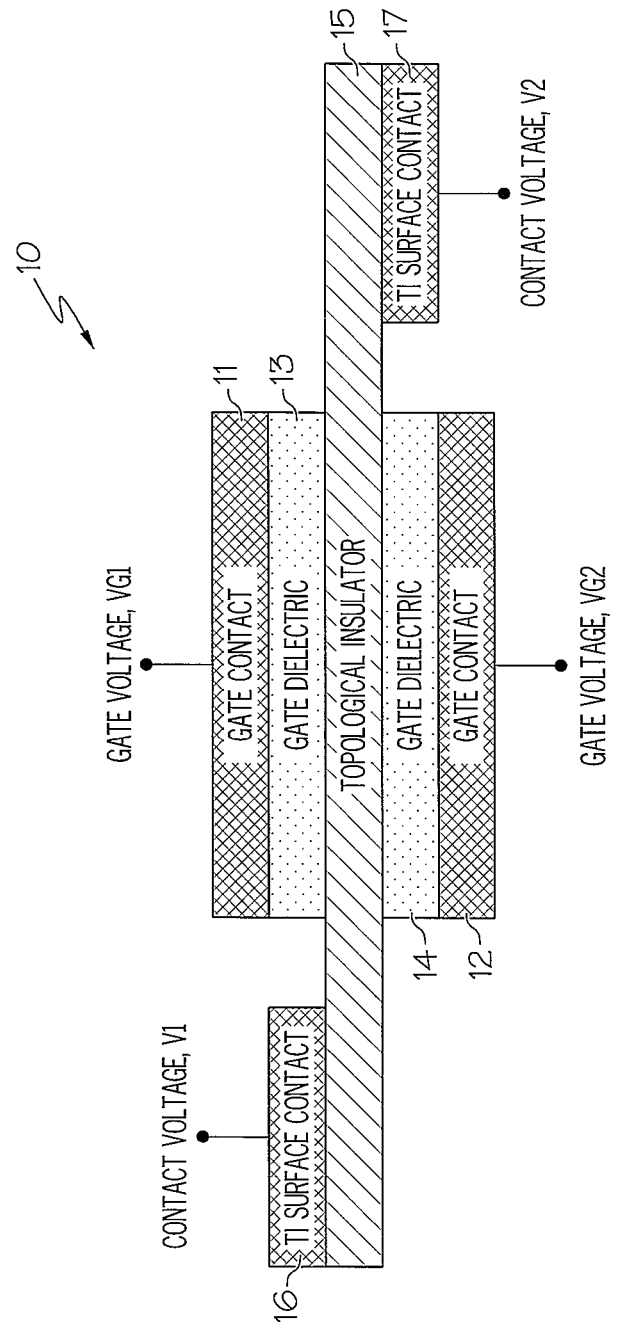
FIG. 1 is a diagram of a topological insulator-based field-effect transistor in which transport is based on surface-to-surface tunneling within one topological insulator layer.

Referring now to the drawings, and in particular to FIG. 1, there is depicted a diagram of a TINFET, in accordance with a preferred embodiment of the present invention. As shown, a TINFET 10 includes a topological insulator (TI) layer 15 formed between a first gate dielectric layer 13 and a second gate dielectric layer 14. TINFET 10 has four terminals, namely, a first gate contact 11, a second gate contact 12, a first TI surface contact 16, and a second TI surface contact 17. First gate contact 11 is connected to first gate dielectric layer 13, and second gate contact 12 is connected to second gate dielectric layer 14. First and second TI surface contacts 16, 17 are connected to opposite surfaces of TI layer 15 to control the voltages of the surface of TI layer 15. In addition, the electrostatic potentials on the surfaces of TI layer 15 can also be altered by first gate contact 11 and second gate contact 12.

Preferably, TI layer 15 is made of materials such as $Bi_2Se_3$, $Bi_2Te_3$ or $Sb_2Te_3$. First and second gate dielectric layers 13, 14 can be made of high-k dielectrics such as silicon dioxide ($SiO_2$), low-k dielectrics or even vacuum.

TINFET 10 is based on special properties of the tunneling conductance between the two-dimensional electron systems on opposite surfaces of TI layer 15 through the bulk insulating band-gap. With little interlayer voltage, $V_{il}=V2-V1$, where V2 is applied to second TI surface contact 17 and V1 is applied to first TI surface contact 16, respectively, and electrons on one surface of TI layer 15 and an equal concentration of holes on the other surface of TI layer 15, coupling between the electrons and holes leads to a correlated excitonic state that results from quantum-mechanical many-particle exchange-correlation effects between the surface charge carriers. Under this condition, TINFET 10 is in a high-conducting ON state with respect to current flow between TI surface contacts 16 and 17. However, beyond some small value $V_{il}$ magnitude (perhaps as low as a few mV), a value referred to as the "critical" interlayer voltage, TINFET 10 enters a negative differential resistance (NDR) regime that leads to a low-conducting OFF state.

The switching operation to change TINFETs from high-conducting ON states to low conducting OFF states involves application of input gate voltage signals VG1 VG2, high or low, to one or more TINFETs. It may also involve ramping the power supply. The gate voltages input signals VG1 and VG2 are altered to control the strength of the correlated excitonic state and, thus, the critical interlayer voltage, or even to eliminate the correlated excitonic state. The values of the required gate voltages will depend on many factors including the work functions of the various materials including the dielectrics and gate contacts.

When the gate input voltages VG1 and VG2 are used to entirely eliminate the correlated excitonic state, these gate input voltages switch TINFET 10 ON and OFF somewhat in the way the gate voltage is used to switch a conventional MOSFET between ON and OFF states. However, with a conventional MOSFET, n-channel (electron channel) devices are ON when the gate voltage is above a certain threshold and p-channel (hole channel) devices are ON when the devices are below a certain threshold. TINFET 10 exhibits ambipolar behavior (i.e., can act either n or p-type) and is ON within some range of input gate voltages VG1 and VG2 when the electron and hole concentrations are sufficiently close to each other to allow the excitonic condensate to form; otherwise, when the electron and hole concentrations are not sufficiently close to each other to allow the excitonic condensate to form, TINFET 10 is OFF.

When the gate input voltage signals are used to only weaken the condensate and, for example, a supply voltage is ramped up across two or more TINFETs hooked up in series through their TI layer contacts (such as TI layer contacts 16, 17), the TINFET that reaches its critical value of interlayer voltage Vil first, as determined by these gate voltages, falls into its low-conductance OFF state. A further supply voltage increase across the series of TINFETs is dropped across the TINFET in the OFF state, while the voltage drop across the remaining TINFETs remains essentially unchanged or decreases. In this way, the TINFET input gate voltage signals VG1 and VG2 control one or more output voltage signals, high or low, read from between TI layer contacts of the two series TINFETs.

In either case, the respective high and low input gate voltages VG1 and VG2 signal levels and the respective high and low output TI surface contact voltage signal levels should match. To match the signal levels with low voltages, one may choose appropriate dual gate work-functions for example such that under zero gate contact voltages, there are already large and balanced electron and hole concentrations (ON state) or still large but not quite balanced charge concentrations (OFF or less strongly ON). The input signals VG1 and VG2 are then only used to unbalance the charge concentrations, to weaken or eliminate the correlated excitonic state, or to balance the charge concentration to form or strengthen the excitonic state. However, the use of such dual gate work-functions adds process complexity.

Furthermore, when the gate voltages VG1 and VG2 are only used to weaken or strengthen the condensate, the critical voltage must be substantially smaller than the supply voltage, perhaps only a few mV. In addition, one may need multiple clocked power supplies to allow multi-level logic. The advantage of using VG1 and VG2 to only weaken or strengthens the condensate, rather than create or eliminate it, is that still lower supply voltages and, thus, less switching energy is required.

Figure 2:
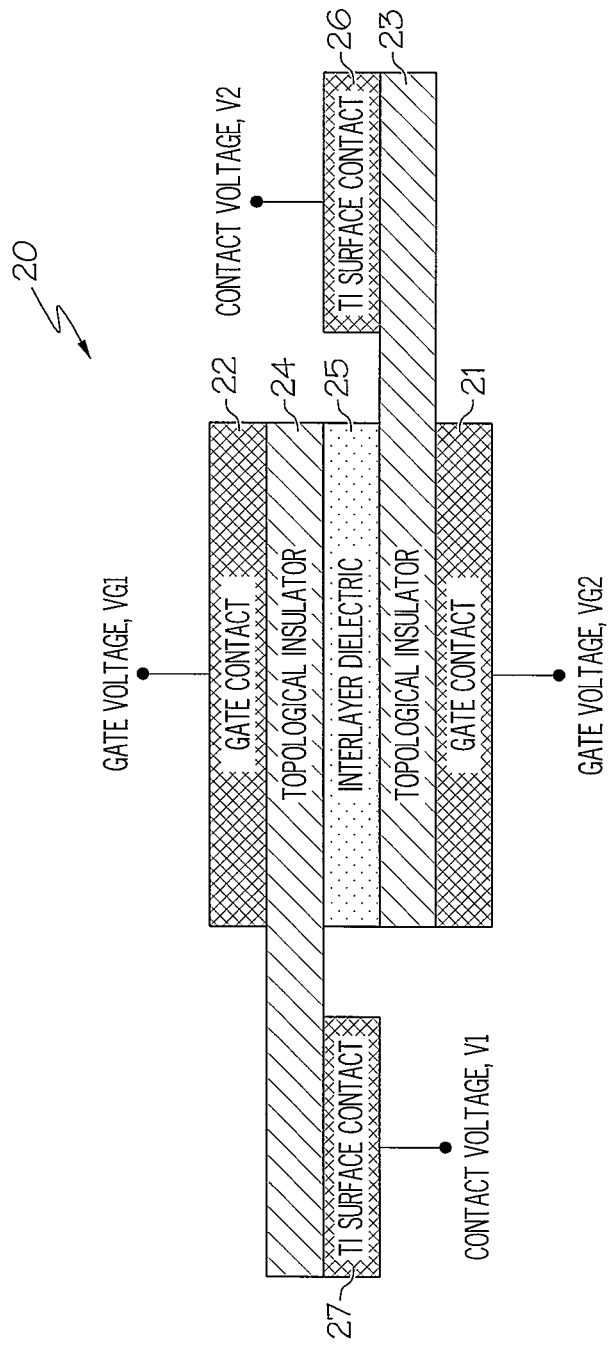
FIG. 2 is a diagram of a topological insulator-based field-effect transistor in which transport is based on surface-to-surface tunneling between adjacent surfaces of two topological insulator layers separated by a dielectric layer.

With reference now to FIG. 2, there is depicted a diagram of a TINFET, in accordance with an alternative embodiment of the present invention. As shown, a TINFET 20 includes an interlayer dielectric layer 25 formed between a first TI layer 23 and a second TI layer 24. TINFET 20 has up to four terminals, namely, a first gate contact 21, a second gate contact 22, a first TI surface contact 26, and a second TI surface contact 27. First gate contact 21 is connected to first TI layer 23, and second gate contact 22 is connected to second TI layer 24. First and second TI layer contacts 26 and 27 are connected to the inner (i.e., adjacent to the interlayer dielectric) surfaces of TI layers 23 and 24, respectively, to control the interlayer voltages drop $V_{il}=V2-V1$ across the interlayer dielectric 25 between TI surface contacts 27 and 26. In addition, the electrostatic potentials on the inner surfaces of TI layer surfaces 25 can also be altered by first gate contact 21 and second gate contact 22.

First TI layer 23 can be grown on a substrate by molecular beam epitaxy (MBE), followed by dielectric deposition, and another TI layer growth. It may be possible to have epitaxial, lattice matched high bandgap dielectrics grown so that they can act as a template for second TI layer 24.

With TINFET 20, the 2D states on the outer surfaces of TI layers 23, 24 would merge with gate contacts 21, 22, while tunneling would occur between the two sets of inner surface states of the TI layers with TI surface contact 26, 27, respectively. The latter geometry would offer the advantage greater flexibility in choice of the tunnel barrier material, and offer the possibility of single-particle coherent conduction band-to-conduction band tunneling and valence band-to-valence band tunneling, both of which are believed to be suppressed between the surface states of even in thin topological insulator, in addition to the possibility of many-particle correlated-excitonic-state-mediated valence-band-to-conduction-band tunneling.

TINFET 20 functions by the same many-particle-based tunneling mechanism as controlled via the gate and inner TI surface contact voltage signals, as TINFET 10 functions as controlled in the same manner by its respective gate and TI surface contact voltage signals.

TINFET 20 may also operate via resonant bare or single-particle tunneling. For the present disclosure, "bare" and "single particle" simply means not relying on the many-particle exchange-correlation effects previously discussed. Resonant single particle tunneling, defined by momentum and energy conservation requirements, would occur when the TI surface potentials are brought into alignment, such that, e.g., the Dirac point energies, are identical on each side. The total current would then be found by integrating over the tunneling rates between the surface states weighted by the differences in occupation probabilities of these states on each surface, as defined largely by the surface Fermi levels and, thus, surface voltages. It is understood that through the requirements of electrostatic self-consistency and various forms of capacitive coupling, the gate voltages and surface layer voltages required to bring the inner surfaces states of the two topological into resonance will be self-consistent functions of one another. Therefore, variations in the TI surface contact voltages will bring the surfaces in and out of resonance. As a result, in particular, a region of negative differential resistance (NDR) behavior as a function of the increasing interlayer voltage difference is to be expected beyond the interlayer voltage difference at which resonance occurs. The interlayer voltages at which resonance occurs can be controlled by the gate voltages. A variety of memory and logic devices based on conventional semiconductor Resonant Tunneling Diodes (RTD) have been proposed in the literature. One can map similar circuit topologies on TINFETs. Also, while it is expected that single-particle interlayer conduction-band-to-conduction-band and valence-band-to-valence-band single particle tunneling will be suppressed across a single topological insulator layer, to the extent that it might not be, we also mean to consider gate-controlled single-particle tunneling between the opposites surfaces of the same topological insulator for this purpose, consistent with TINFET 10 of FIG. 1.

For both TINFET 10 and TINFET 20, electrical contact to only one of the gates is needed for control, the second gate is shown for generality (i.e., the second gate may not be necessary). Otherwise, the second gate could simply represent a substrate of varying work function, perhaps but not necessarily heavily doped and/or grounded. In the latter case, the corresponding topological insulator could also be quite thick, even acting in part or whole as a substrate itself.

Figure 3:
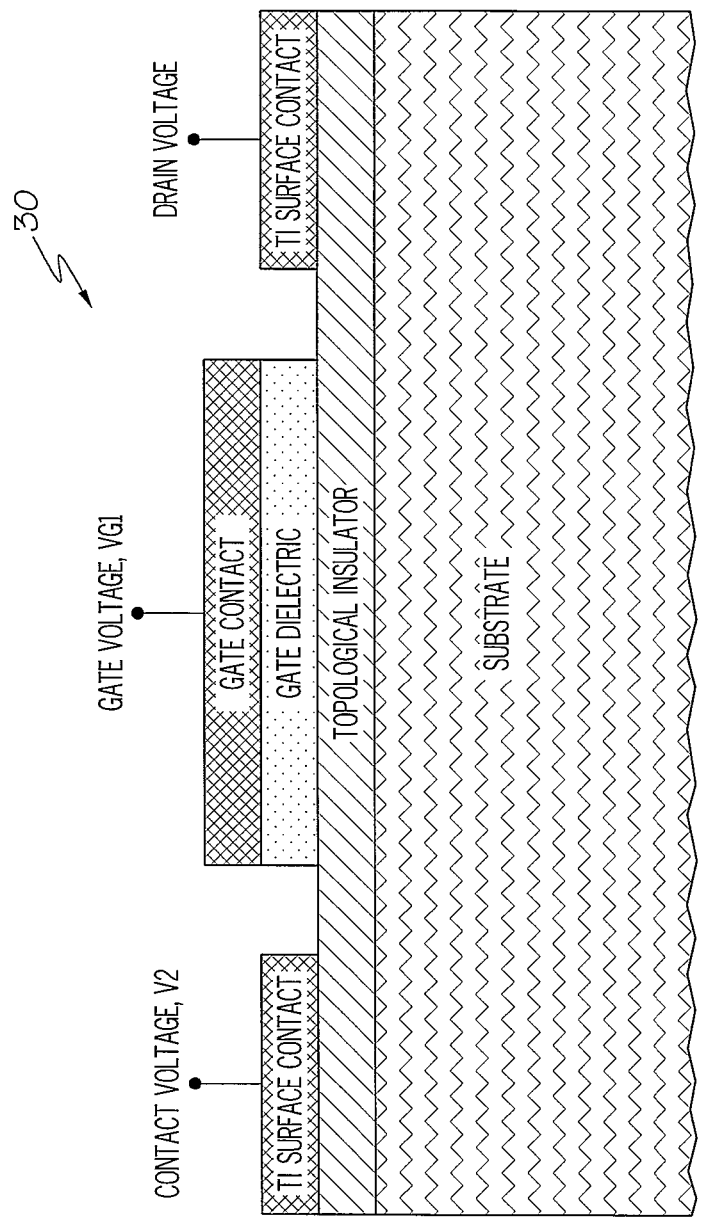
FIG. 3 is a diagram of a topological insulator-based field-effect transistor that is not based on surface-to-surface tunneling-mediated transport.

Referring now to FIG. 3, there is depicted one class of TINFET that is not based on interlayer tunneling-mediated transport. As shown, a TINFET 30 is very similar to conventional MOSFETs. These could be analogous to graphene FETs, or to ultra-thin body silicon-on-insulator FETs but with more nearly true 2D channels. As with graphene, OFF-state leakage nominally would be very high because of the lack of a natural bandgap for these surface states. However, it may be possible to open an energy band gap by one of two methods: One may be able to form narrow nano-ribbons of these topological insulators and open up gaps as with graphene nano-ribbons, but with states that might be much more robust to edge defects that plague graphene nano-ribbons. One can envision parallel arrays of these nano-ribbons, as well as vertically stacked superlattices of these topological insulators to increase drive currents. Alternatively, for very thin topological insulator layers, coupling between the quasi 2D states of the two surfaces opens up a band gap even under flat-band conditions, a band gap associated with quantum mechanical coupling through the thin body of the topological insulator between the electron and valance band states near what would otherwise be the Dirac points on opposite surfaces. A band gap only occurs in graphene when graphene bilayers are used under strong surface normal electric fields. Of course, a large bandgap within the TI system would imply significant delocalization of the surface states through the body of the topological insulator near the band edges of the surface states. Furthermore, with what would be a surface-normal-field-dependent band structure in such thin topological insulators, the gate contacts may provide additional control over the band edge energy and, thus, switching beyond simply controlling the electrostatic potential reference, for further possible beyond-CMOS gate control.

Alternatively, the gate dielectric of FIG. 3 can be eliminated so that the gate is connected directly to one surface of the TI, the TI surface contacts connected to opposite surface of the TI. This can be described as the structure of FIG. 2, but with the second TI surface contact may also contacted to the surface of the first TI layer, and the second TI layer eliminated. With this configuration, the TINFET would again be analogous to graphene FETs, or to ultra-thin body silicon-on-insulator FETs but with more nearly true 2D channels. But, as with graphene monolayers, OFF-state leakage nominally would be very high because of the lack of a natural bandgap for these surface states. However, gate leakage would prevent introduction of a bandgap for the surface layer states through use of a very thin TI layer.

As has been described, the present invention provides a new type of transistor named TINFET. By providing a mechanism of gate control over the current in the channel that is not subject to thermonic emission in tunneling-based TINFETs, acceptable switching operation can be achieved over smaller voltage ranges, allowing more energy efficient operation. Two such mechanisms are considered within the considered TINFET structures, a many-particle based mechanism relying on quantum mechanical exchange-correlation effects, and a single-particle based mechanism relying on resonant tunneling. Furthermore, the associated reduction in power dissipation should allow for greater device density and, thus, increased computational power in CMOS-like logic circuits. Even in the case of the MOSFET-like class of TINFETS, more truly 2-D surfaces states may improve transport properties and gate control and allows one to more closely approach the ideal limit for MOSFETs. Inter-surface coupling across the TI can be used to introduce a band-gap in the TI surface layer band structure. Furthermore, with an inter-surface-field-dependent band structure in thin topological insulators, the gate may provide additional control over the band edge beyond simply controlling the electrostatic potential reference, for further possible beyond-CMOS gate control.

While the invention has been particularly shown and described with reference to a preferred embodiment, it will be understood by those skilled in the art that various changes in form and detail may be made therein without departing from the spirit and scope of the invention.

What is claimed is:

1. A topological insulator-based field-effect transistor comprising:
    a topological insulator layer;
    a first and second gate dielectric layers separated by said topological insulator layer;
    a first gate contact connected to said first gate dielectric layer;
    a second gate contact connected to said second gate dielectric layer;
    a first topological insulator surface contact connected to a surface of said topological insulator layer adjacent to said first gate dielectric layer; and
    a second topological insulator surface contact connected to a surface of said TI layer adjacent to said second gate dielectric layer.

2. The transistor of claim 1, wherein said topological insulator layer is a compound selected from the group consisting of $Bi_2Se_3$, $Bi_2Te_3$ and $Sb_2Te_3$.

3. The transistor of claim 1, wherein said first and second gate dielectric layers are made of silicon dioxide.

4. The transistor of claim 1, wherein said first and second gate dielectric layers are made of vacuum.

5. The transistor of claim 1, wherein said topological insulator layer is sufficiently thin to allow the formation of a bandgap.

6. A topological insulator-based field-effect transistor comprising:
    a first and second topological insulator layers;
    an interlayer dielectric layer connecting said first and second topological insulator layers;
    a first gate contact connected to a surface of said first topological insulator layer that is opposite said interlayer dielectric layer;
    a second gate contact connected to a surface of said second topological insulator layer that is opposite said interlayer dielectric layer;
    a first topological insulator surface contact connected to a surface of said first TI layer adjacent to said interlayer dielectric layer; and
    a second topological insulator surface contact connected to a surface of said second TI layer adjacent to said interlayer dielectric layer.

7. The transistor of claim 6, wherein said first and second TI layers are compounds selected from the group consisting of $Bi_2Se_3$, $Bi_2Te_3$ and $Sb_2Te_3$.

8. The transistor of claim 6, wherein said interlayer dielectric layer is made of silicon dioxide.

9. The transistor of claim 6, wherein said interlayer dielectric layer is made of vacuum.

10. The transistor of claim 6, wherein said first and second topological insulator layers are sufficiently thin to allow the formation of bandgaps.

11. The transistor of claim 1, wherein each of said first and second topological insulator surface contacts allows independent voltage connection to said topological insulator layer.

* * * * *

UNITED STATES PATENT AND TRADEMARK OFFICE
CERTIFICATE OF CORRECTION

PATENT NO. : 8,629,427 B2  
APPLICATION NO. : 13/097405  
DATED : January 14, 2014  
INVENTOR(S) : Sanjay K. Banerjee et al.

Page 1 of 1

It is certified that error appears in the above-identified patent and that said Letters Patent is hereby corrected as shown below:

On the Title Page, in Item (73) Assignee, please replace "Texas A&M University, College Station, TX (US)" with -- Board of Regents, The University of Texas System, Austin, TX (US) --.

Signed and Sealed this
First Day of July, 2014

Michelle K. Lee
*Deputy Director of the United States Patent and Trademark Office*